United States Patent
Oh

(10) Patent No.: US 7,096,373 B2
(45) Date of Patent: Aug. 22, 2006

(54) SYSTEM AND METHOD FOR OPTIMIZING CLOCK SPEED GENERATION IN A COMPUTER

(75) Inventor: Jang Geun Oh, Suwon-si (KR)

(73) Assignee: LG Electronics Inc., Seoul (KR)

( * ) Notice: Subject to any disclaimer, the term of this patent is extended or adjusted under 35 U.S.C. 154(b) by 505 days.

(21) Appl. No.: 10/003,345

(22) Filed: Dec. 6, 2001

(65) Prior Publication Data

US 2002/0073351 A1 Jun. 13, 2002

(30) Foreign Application Priority Data

Dec. 9, 2000 (KR) ............................... 2000-74974

(51) Int. Cl.
*G06F 13/00* (2006.01)

(52) U.S. Cl. .................. 713/320; 713/322; 713/323; 713/600; 711/44; 711/154

(58) Field of Classification Search ................ 713/600, 713/320, 322, 323; 711/154, 44; 327/44
See application file for complete search history.

(56) References Cited

U.S. PATENT DOCUMENTS

| | | | | |
|---|---|---|---|---|
| 5,588,004 A * | 12/1996 | Suzuki et al. | ............... | 370/516 |
| 5,754,867 A * | 5/1998 | Walker | ...................... | 713/322 |
| 5,918,058 A * | 6/1999 | Budd | ........................ | 713/300 |
| 5,918,061 A * | 6/1999 | Nikjou | ...................... | 713/324 |
| 6,163,851 A * | 12/2000 | Yamazoe et al. | ........... | 713/600 |
| 6,442,407 B1 * | 8/2002 | Bauer et al. | ................. | 455/574 |
| 6,535,449 B1 * | 3/2003 | Miyauchi | ................... | 365/227 |
| 6,564,332 B1 * | 5/2003 | Nguyen et al. | ............. | 713/340 |
| 6,668,292 B1 * | 12/2003 | Meyer et al. | ................ | 710/61 |
| 6,704,879 B1 * | 3/2004 | Parrish | ...................... | 713/322 |
| 6,763,478 B1 * | 7/2004 | Bui | ............................ | 713/600 |

* cited by examiner

Primary Examiner—A. Elamin
(74) Attorney, Agent, or Firm—Fleshner & Kim, LLP

(57) ABSTRACT

The present invention relates to a method of reducing a clock speed of a host bus to extend battery life and its operating time when a battery is supplying electric energy for a portable computer. A bus clock controlling apparatus according to the present invention includes power mode detecting means detecting a current power mode, the power mode indicative of which power source supplies the portable computer with electric energy; and clock adjusting means adjusting frequency of an applied clock from a clock generator based on the detected power mode by said power mode detecting means, and applying the frequency-adjusted clock to one or more controlling devices. Due to this invention, an electric energy stored in a battery equipped in a portable computer is saved, as a result, the battery life is extended.

26 Claims, 4 Drawing Sheets

PWR Mode (AC power or Battery)

SYSTEM AND METHOD FOR OPTIMIZING CLOCK SPEED GENERATION IN A COMPUTER

BACKGROUND OF THE INVENTION

1. Field of the Invention

The present invention relates to an apparatus and a method of controlling clock frequency generation, and more particularly, to an apparatus and a method for a portable device.

2. Background of the Related Art

In general, a portable device such as a notebook computer can be supplied with its necessary electric energy either by a battery or an AC power line. However, because battery capacity is limited, a notebook cannot be used for more than a few hours if its power is supplied from the battery.

FIG. 1 is a simplified block diagram of a related art notebook. The notebook of FIG. 1 comprises a CPU 11 conducting ordinary well-known operations and functions; a bridge controller 12 conducting both assistant operations of the CPU 11 and management of memories, a video port, a bus, etc.; a video processor 13 for processing video data and outputting the processed data for video presentation; and a clock generator 10 providing a 100 MHz clock signal 1 for the CPU 11 and the bridge controller 12, and a 66 MHz clock signal 2 for the video processor 13.

A PLL (Phase Lock Loop) circuit 110 is embedded in the CPU 11. The PLL circuit 110 multiplies the 100 MHz clock from the clock generator 10 differently based on a current power supplying mode. For example, the PLL circuit 110 multiplies the 100 MHz clock 1 by a factor of six to produce a 600 MHz internal clock if an AC power mode (PWR mode) is detected, and it multiplies the 100 MHz clock 1 by a factor of five to produce a 500 MHz clock if a battery power mode is detected.

Because power consumption of a CPU 11 is proportional to the speed of a clock driving the CPU 11, if a 500 MHz internal clock is used in a battery supplying mode, processing speed is lowered and power dissipation is decreased in comparison with a 600 MHz internal clock. Therefore, battery life is extended.

However, in a related portable computer, a host bus 3 to which both a CPU 11 and a bridge controller 12 are connected is driven by a bus clock to bridge controller 12 whose speed is fixed regardless of power supplying mode. Therefore, power saving in a battery supplying mode is less effective.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a method of reducing clock speed of a bus in order to extend battery suppliable time longer when electric energy is fed to a portable computer such as a notebook from an equipped battery.

In order to achieve at least the above-described objects of the present invention in a whole or in part, there is provided a portable device having a CPU and a bridge controller operating in one of AC power mode or battery power mode, wherein the improvement includes a clock generator generating a first clock signal for the CPU and a second clock signal for the bridge controller, wherein first and second clock signals are two distinct clock signals outputted by the clock generator and have different frequencies.

To further achieve at least the above-described objects of the present invention in a whole or in parts, there is provided a portable device having a CPU and a bridge controller, wherein the improvement includes a clock generator generating a first clock signal, and a clock adjustor operating in one of AC power mode or battery power mode, said clock adjustor generating a second clock signal for the CPU and a third clock signal for the bridge controller, wherein the second and third clock signals are two distinct clock signals outputted by the clock adjustor and have different frequencies.

To further achieve at least the above-described objects of the present invention in a whole or in parts, there is provided a method for optimizing clock speed generation, including receiving a base clock signal, multiplying the base clock signal by a first factor to produce a first higher frequency clock signal, wherein the first higher frequency clock signal is phase-locked with the base clock signal, receiving a power mode signal indicating either an AC or a battery source, and selectively outputting the first higher frequency clock signal to a first device when the AC source is indicated and outputting the base clock signal to the first device when the battery source is indicated.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

In order that the invention may be fully understood, preferred embodiments thereof will now be described with reference to the accompanying drawings.

Figure 1:
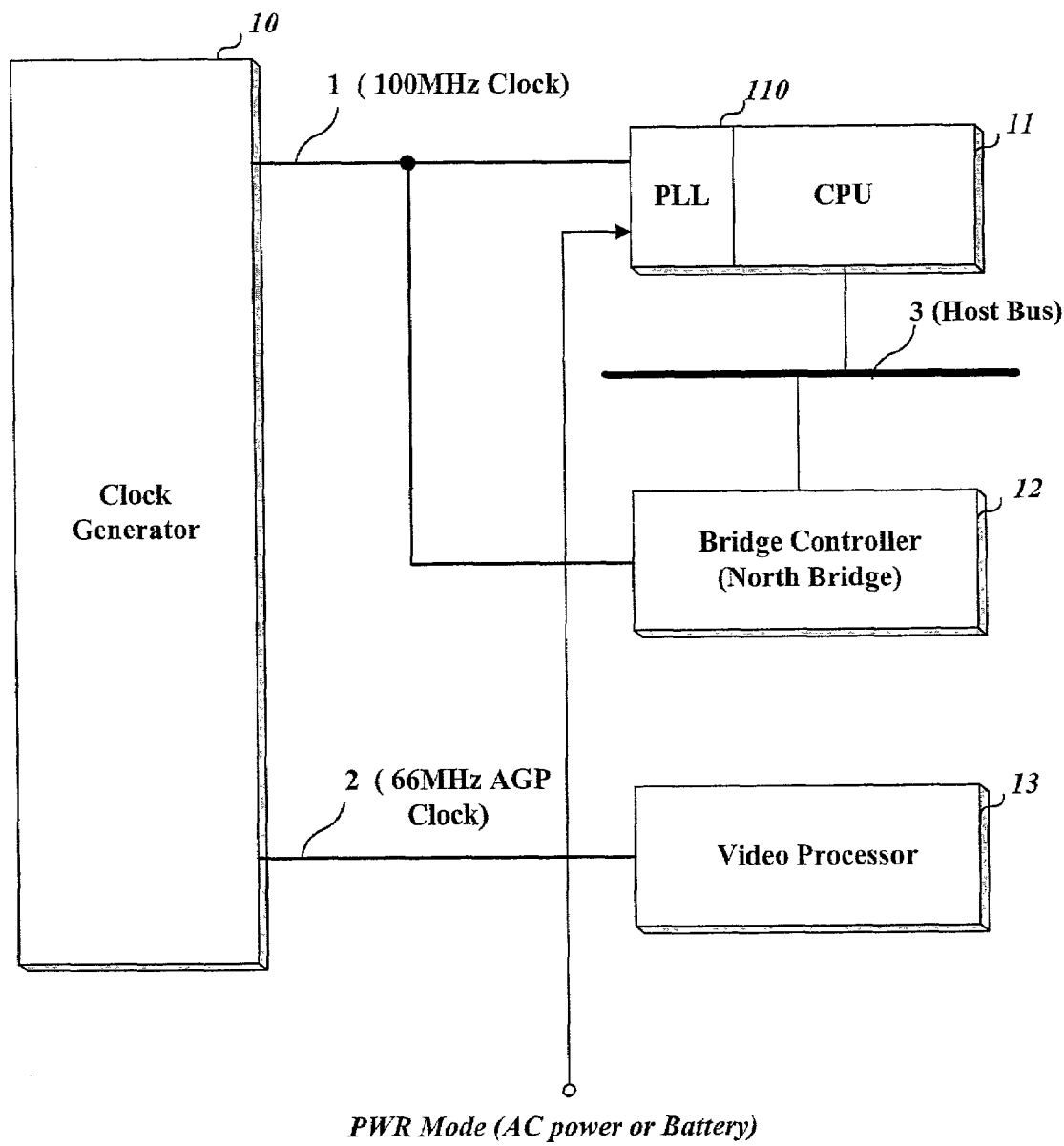
FIG. 1 is a partial block diagram of a related art computer.
Figure 2:
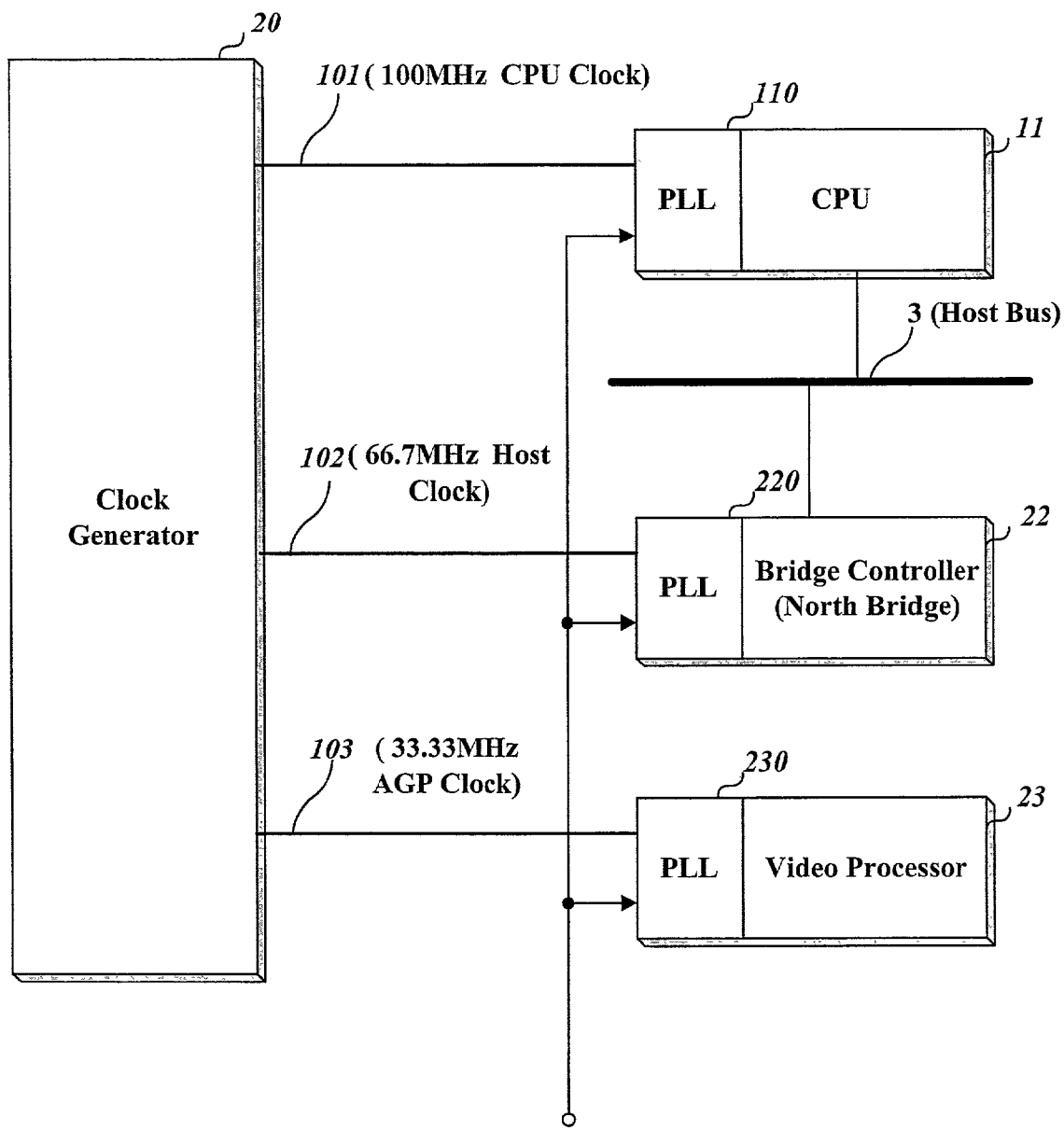
FIG. 2 is a partial block diagram of a portable computer in which a bus clock controlling apparatus in accordance with a preferred embodiment of the present invention is embedded.

FIG. 2 is a block diagram of a portable computer in which a bus clock controlling apparatus in accordance with the present invention is embedded. The portable computer of FIG. 2 includes a CPU 11, a bridge controller 22, and a video processor 23. The portable computer of FIG. 2 further comprises a clock generator 20 which may provide CPU 11, bridge controller 22 and video processor 23 with necessary clock signals.

The clock generator 20 may provide the CPU 11 with a 100 MHz CPU clock signals 101, the bridge controller 22 with a 66.7 MHz host clock signals 102 (lower in frequency than the 100 MHz CPU clock 101), and the video processor 23 with a 33.33 MHz clock signal 103 (lower in frequency than a conventional 66 MHz AGP clock).

A PLL circuit 210 may be included in the CPU 11. As aforementioned, the PLL circuit 110 may multiply the 100 MHz CPU clock 101 from the clock generator 20 selectively based on the current power supplying mode. For example, the PLL circuit 110 may multiply the frequency of a 100 MHz clock 101 by six if an external AC power is fed, and it may multiply the frequency by five if a battery is supplying necessary electric energy.

In addition, another PLL circuit 220 may be embedded in the bridge controller 22. The PLL circuit 220 may multiply the frequency of the 66.7 MHz host clock 102 from the clock generator 20 by one and a half to produce a 100 MHz PCI bus clock in an AC power supplying mode, and may use the 66.7 MHz host clock 102 as it is without frequency multiplication in a battery supplying mode.

Figure 3:
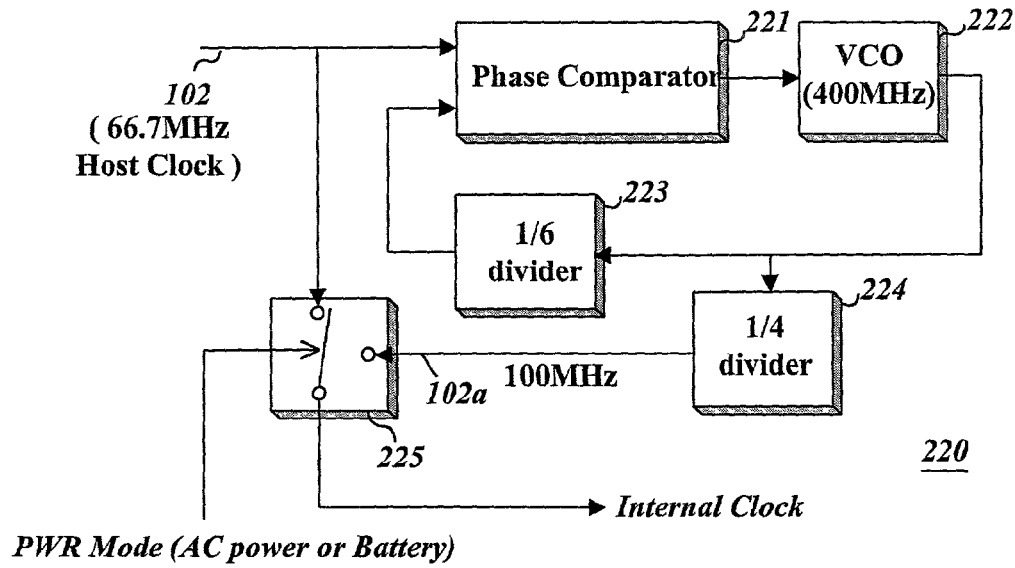
FIG. 3 is a detailed block diagram of the PLL circuit built in a controlling device according to the embodiment of FIG. 2.

FIG. 3 is a detailed block diagram of the PLL circuit 220. The PLL circuit 220 may include a phase comparator 221 outputting a DC voltage proportional to the phase difference between the 66.7 MHz host clock 102 and a divided internal oscillating clock; a voltage controlled oscillator (VCO) 222 generating the internal oscillating clock of about 400 MHz whose frequency varies in proportion to the level of the DC voltage applied from the phase comparator 221; a $\frac{1}{6}$ frequency divider 223 dividing the 400 MHz internal oscillating clock by 6 to produce a 66.7 MHz clock; a $\frac{1}{4}$ frequency divider 224 dividing the 400 MHz internal clock by 4 to produce a 100 MHz clock; and a switch 225 selecting the inputted 66.7 MHz host clock 102 or the divided 100 MHz clock 102a in accordance with the power supplying mode to output a host bus clock or to use it as an internal operation clock.

The PLL comparator 221 may output a DC signal to increase or decrease the frequency of the internal oscillating clock generated by VCO 222 in proportion to the phase difference between two applied signals, so that the two applied signals become in phase exactly. Therefore, the frequency of the internal oscillating clock may be six times as high as that of the inputted 66.7 MHz host clock 102 while its phase is locked with the host clock 102. Accordingly, if the internal oscillating clock frequency is divided by 4, a 100 MHz clock whose phase is locked with the inputted host clock 102 may be produced and it can be used as a bus clock of a host bus through the bridge controller 22.

The switch 225 may select the 66.7 MHz host clock 102 when the power supplying mode is indicative of the battery mode, while it may select the 100 MHz clock 102a divided from the internal oscillating clock in the external AC supplying mode. If a battery is supplying electric energy, the above elements 221, 222, 223, and 224 need not be operative, thus it may be preferable to cut off power supply for them in that mode.

The video processor 23 may also include PLL circuit 230. The PLL circuit 230 of the video processor 23 may multiply the 33.33 MHz clock from the clock generator 20 by two to produce a 66.7 MHz AGP video clock in AC power supplying mode, and may use the 33.33 MHz clock without frequency multiplication in battery supplying mode.

The structure of the PLL circuit 230 may be similar to that shown in FIG. 3 except for the frequency dividing ratio and other respects. In the PLL circuit 230 whose input frequency is 33.33 MHz, a 200 MHz-oscillating clock may be generated from an internal clock generator (corresponding to the element 222 of FIG. 3), and a $\frac{1}{3}$ frequency divider (corresponding to the element 224 of FIG. 3) may be used. In this instance a clock output by the $\frac{1}{3}$ frequency divider is at a frequence of 66.7 MHz.

In the portable computer configured as above, if a battery is supplying electric energy, the frequency of a bus clock provided to a host bus by the bridge controller 22 may be decreased to 66.7 MHz from 100 MHz, and the frequency of an internal clock used by the video processor 23 may also be decreased to 33.33 MHz from 66.7 MHz. This clock speed reduction results in extension of battery life.

A detecting means, which outputs a signal indicating power supplying mode after detecting which power source between an external AC power and a battery is supplied at present, can be integrated into the bridge controller 22 or may be implemented as a separate device.

Figure 4:
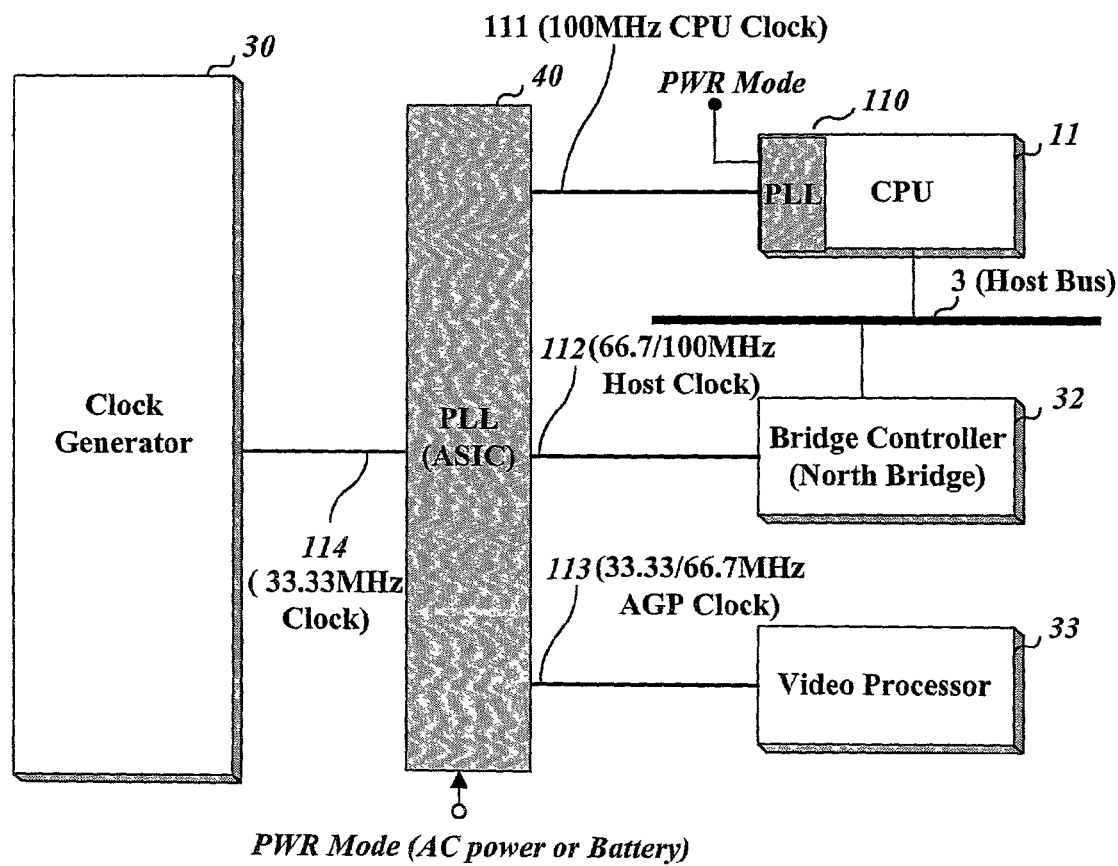
FIG. 4 is a block diagram of a portable computer in which another bus clock controlling apparatus in accordance with a preferred embodiment the present invention is embedded.

FIG. 4 is a block diagram of a portable computer in which another bus clock controlling apparatus in accordance with the present invention is embedded. In the block diagram of FIG. 4, PLL circuits for reducing clock speed in battery mode may not be included in the bridge controller 32 and the video processor 33. Instead, a separate PLL block 40 may be included in the embodiment of FIG. 4. The PLL block 40, which can be manufactured with a customized semiconductor such as an ASIC (Application Specific Integrated Circuit), may provide each element with respective necessary clocks of mutually different frequency. A clock generator 30 may be further included in the embodiment of FIG. 4 to supply the PLL block 40 with a basic clock 114 of 33.33 MHz.

However, a PLL circuit 110 for producing 600 MHz or 500 MHz by multiplying 100 MHz differently may be embedded in the CPU 11 as mentioned above.

The frequency 33.33 MHz of the basic clock 114 applied to the PLL block 40 from the clock generator 30 may be equal to the lowest among clock frequencies the PLL block 40 provides in battery supplying mode. The PLL block 40 may be configured as in FIG. 5 to supply all clocks, namely, 100 MHz clock necessary to the CPU 11 regardless of power supplying mode, and 33.33 MHz, 66.7 MHz and 100 MHz clocks which are selectively provided to the bridge controller 32 and video processor 33 according to power supplying mode.

Figure 5:
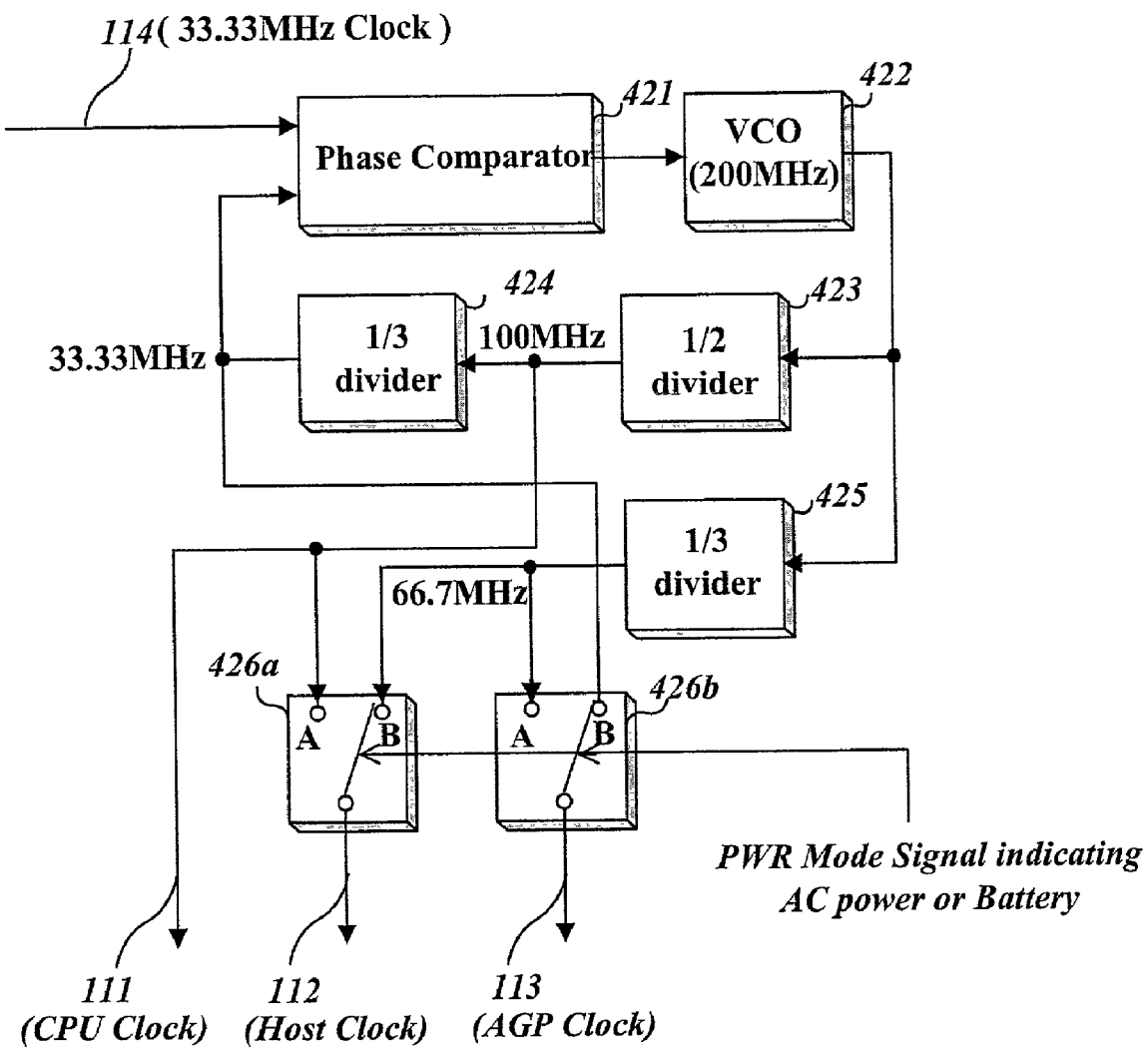
FIG. 5 is a detailed block diagram of the PLL block applying each clock to each device according to the embodiment of FIG. 4.

A phase comparator 421 of FIG. 5 may adjust the frequency of the approximately 200 MHz oscillating clock of a VCO 422 in proportion to a detected phase difference between the 33.33 MHz clock 114 from clock generator 30 and a $\frac{1}{6}$ divided clock from the 200 MHz oscillating clock. As a result, the phase of the 200 MHz oscillating clock may be locked with the applied 33.33 MHz clock 114 from clock generator 30.

In phase-locked state of the 200 MHz clock, a 100 MHz clock may be produced from a $\frac{1}{2}$ divider 423 dividing the 200 MHz clock by two, and 66.7 MHz clock may also be produced from a $\frac{1}{3}$ divider 425 dividing the 200 MHz clock by three. Therefore, the 100 MHz clock 111 from the $\frac{1}{2}$ divider 423 may be applied to the CPU 11 at all times.

In the circuit of FIG. 5, switches 426a and 426b select 'A' terminals as input if power supplying mode is indicative of external AC, so that the 100 MHz clock is applied to the bridge controller 32 as host clock 112 and the 66.7 MHz clock is applied to the video processor 33 as AGP clock 113.

If electric power is fed from a battery, 'B' terminals are chosen; therefore, the host clock 112 and the AGP clock 113 become 66.7 MHz and 33.33 MHz, respectively.

Accordingly, lower frequency clocks in battery mode than in AC mode may be provided for corresponding devices, which means that power consumption is reduced when a battery is supplying necessary electric energy.

In the embodiments of FIGS. 2 and 4, the output clocks of the clock generators 20 and 30 may be applied without regard to power supplying mode. Furthermore, in the embodiments of FIGS. 2 and 4, clock frequency adjusting means may be embedded in the CPU, bridge controller, and video processors or implemented as a separate device.

As can be appreciated, based on the disclosure of the preferred embodiments, the output of the clock generators 20 and 30 of FIGS. 2 and 4, respectively, may be applied without raising the frequency during the battery power mode but increasing the clock frequency if an AC power mode is detected. Alternatively, the output of the clock generators 20 and 30 may be applied without frequency adjustment in the AC power mode but decreasing the clock frequency if a battery power mode is detected.

In another embodiment, the clock frequency adjusting means may be integrated into a clock generator 30. The clock frequency adjusting means mentioned here is a device which adjusts or maintains frequency of an input clock based on which power source is feeding electric energy, and applies the frequency-adjusted or -maintained clock to external devices.

An alternative embodiment of the invention, the frequency adjusting means may be embedded in other combinations of the clock generator, PLL ASIC, CPU, bridge controller, video processor, and/or other devices.

The bus clock controlling apparatus of a portable computer according to the present invention reduces speed of a bus clock and a device clock in battery mode. Therefore, electric energy stored in a battery is saved, extending battery life.

In addition, the present invention can be applied to a PCI bus for data communication among peripheral devices connected to the PCI bus by providing the clock to another Bridge controller for a PCI bus in the same way as for the host bus.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An apparatus having a CPU wherein the improvement comprises:
    a clock generator generating a first clock signal for the CPU, and a second clock for the bridge controller, wherein the first and second clock signals are two distinct clock signals outputted by the clock generator and have different frequencies; and
    a bridge controller comprising a logic device for outputting the second clock signal adjusted based on a power source and independent of the first clock signal.

2. The apparatus of claim 1, wherein the bridge controller controls a clock speed of a bus connected between the CPU and the bridge controller for data communication among a plurality of peripheral devices of the apparatus using the adjusted second clock.

3. The apparatus of claim 1, wherein the power source is one of AC power mode and battery power mode.

4. The apparatus of claim 1, wherein the apparatus further includes a video processor and the clock generator generates a third clock signal for the video processor, the third clock signal being distinct from the first and second clock signals and having a different frequency than the first and second clock signals.

5. The apparatus of claim 4, wherein the improvement further comprises a second logic device for receiving the third clock signal and adjusting the third clock signal based on the power source.

6. The apparatus of claim 4, wherein the first clock signal has a higher frequency than the second clock signal and the second clock signal has a higher frequency than the third clock signal, and wherein the bridge controller controls a clock speed of a bus for data communication with the CPU.

7. The apparatus of claim 1, wherein the logic device increases a frequency of the second clock signal in an AC power mode and outputs the second clock signal without a frequency adjustment in a battery power mode.

8. The apparatus of claim 1, wherein the logic device outputs the second clock signal in a battery power mode without a frequency adjustment.

9. The apparatus of claim 5, wherein the second logic device increases a frequency of the third clock signal in an AC power mode and outputs the third clock signal without a frequency adjustment in a battery power mode.

10. The apparatus of claim 5, wherein the second logic device outputs the third clock signal in a battery power mode without a frequency adjustment.

11. The apparatus of claim 5, wherein the first logic is a phase locked loop (PLL) and the second logic device is a PLL.

12. An apparatus having a CPU and a bridge controller, wherein the improvement comprises:
    a clock generator generating a first clock signal; and
    a clock adjustor receiving the first clock signal and operating in a power source mode, said clock adjustor generating a second clock signal for the CPU and a third clock signal for the bridge controller, wherein the second and third clock signals are two distinct clock signals outputted by the clock adjustor and have frequencies that are independent of each other, wherein the apparatus further includes a video processor and the clock adjustor generates a fourth clock signal for the video processor, the fourth clock signal being distinct from the second and third clock signals and having a different frequency than the second and third clock signals.

13. The apparatus of claim 12, wherein the bridge controller controls a clock speed of a bus for data communication among a plurality of peripheral devices of the apparatus.

14. The apparatus of claim 13, wherein the clock adjustor is a phase locked loop (PLL), and wherein the bus is a host bus.

15. The apparatus of claim 12, wherein the CPU further comprises a phase locked loop (PLL) receiving the second clock signal for the CPU and adjusting the second clock signal based on one of AC power mode and battery power mode.

16. The apparatus of claim 12, wherein the second clock signal has a higher frequency than the third clock signal and the third clock signal has a higher frequency than the fourth clock signal.

17. The apparatus of claim 12, wherein the power source is one of an AC power mode or a battery power mode.

18. The apparatus of claim 12, wherein the clock adjuster adjusts the third clock signal for the bridge controller based on the power source mode and independent of the second clock signal.

19. The apparatus of claim 12, wherein the second and third clock signals are independent of each other in each of at least two power source modes, and wherein the second clock signal includes at least two different frequencies selected in accordance with the power source mode.

20. A method for performing clock speed generation, comprising:
- receiving a base clock signal;
- selectively multiplying the base clock signal by a first factor to produce a first higher frequency clock signal, and by a second factor to produce a second higher frequency clock signal, wherein the first and second higher frequency clock signals are different and phase-locked with the base clock signal;
- receiving a power mode signal;
- selectively outputting the first higher frequency clock signal to a first device and the second higher frequency clock signal to a second device based on the power mode signal, wherein the first device is a processor and the second device is a bridge controller; and
- generating a third higher frequency clock signal for a video processor, wherein the third clock signal being distinct from the first and second clock signals and having a different frequency than the first and second clock signals.

21. The method of claim 20, wherein the power mode signal is an AC power mode signal or a battery power mode signal and the second higher frequency clock signal is selectively output independent of the first higher frequency clock signal.

22. The method of claim 20, wherein the second higher frequency clock signal is selectively output independent of the first higher frequency clock signal, and wherein the second higher frequency clock signal is selectively output by being output as is or reduced according to the power mode signal.

23. The method of claim 20, wherein the second higher frequency clock signal has at least two different frequencies selected in accordance with the power mode signal.

24. A method for performing clock speed generation, comprising:
- supplying a first clock signal by a first logic to generate a first higher frequency clock signal to a CPU;
- supplying a second clock signal by a second logic to generate a second higher frequency clock signal to a bridge controller, wherein the first and second clock signals are distinct;
- receiving by the second logic, a power mode signal and adjusting the second clock signal; and
- selectively outputting the second higher frequency clock signal based on the power mode signal independent of the first clock signal, wherein the bridge controller controls a clock speed of a bus connected therebetween for data communication with the CPU using the outputted second higher frequency clock signal.

25. The method of claim 24, wherein the first clock signal is greater than the second clock signal, wherein the power mode signal is an AC power mode signal or battery power mode signal.

26. The method of claim 24, wherein the first logic and the second logic are PLLs (Phase Locked Loop).

* * * * *